(12) United States Patent
Yu et al.

(10) Patent No.: US 8,654,589 B2
(45) Date of Patent: Feb. 18, 2014

(54) CHARGE PUMP CONTROL SCHEME FOR MEMORY WORD LINE

(75) Inventors: Hung-Chang Yu, Hsinchu (TW); Yue-Der Chih, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 173 days.

(21) Appl. No.: 12/970,123

(22) Filed: Dec. 16, 2010

(65) Prior Publication Data

US 2012/0134228 A1 May 31, 2012

Related U.S. Application Data

(60) Provisional application No. 61/418,224, filed on Nov. 30, 2010.

(51) Int. Cl.
*G11C 7/00* (2006.01)

(52) U.S. Cl.
USPC ............ 365/185.21; 365/189.07; 365/189.11; 365/207

(58) Field of Classification Search
USPC ............... 365/185.21, 185.18, 185.2, 189.06, 365/189.07, 207, 185.09, 185.24, 185.02, 365/210, 189.11
See application file for complete search history.

(56) References Cited

U.S. PATENT DOCUMENTS

| | | | | |
|---|---|---|---|---|
| 6,381,187 | B1 * | 4/2002 | Lee et al. ................. | 365/189.15 |
| 6,559,710 | B2 * | 5/2003 | Matsuoka ..................... | 327/537 |
| 7,272,047 | B2 * | 9/2007 | Chae et al. ............... | 365/185.19 |
| 7,286,406 | B2 * | 10/2007 | Lutze et al. .............. | 365/185.18 |
| 2002/0118571 | A1 * | 8/2002 | Roohparvar ............. | 365/185.18 |
| 2003/0021155 | A1 * | 1/2003 | Yachareni et al. ....... | 365/185.22 |
| 2005/0270892 | A1 * | 12/2005 | Perroni et al. ................. | 365/233 |
| 2010/0246305 | A1 * | 9/2010 | Yang et al. ..................... | 365/226 |

\* cited by examiner

*Primary Examiner* — Son Dinh

(74) *Attorney, Agent, or Firm* — Lowe Hauptman & Ham, LLP

(57) ABSTRACT

A memory includes a word line, a charge pump coupled to the word line, and a charge pump control circuit coupled to the charge pump. The charge pump control circuit is configured to turn on the charge pump if the word line voltage is lower than a first threshold voltage and turn off the charge pump if the word line voltage is higher than a second threshold voltage.

18 Claims, 4 Drawing Sheets under review. It is understood that other transistors can be used to implement the current mirror circuit 202 and the comparator circuit 204.

CHARGE PUMP CONTROL SCHEME FOR MEMORY WORD LINE

CROSS-REFERENCE TO RELATED APPLICATIONS

The present application claims priority of U.S. Provisional Patent Application Ser. No. 61/418,224, filed on Nov. 30, 2010, which is incorporated herein by reference in its entirety.

TECHNICAL FIELD

The present disclosure relates generally to an integrated circuit, and more particularly to a charge pump.

BACKGROUND

In a memory, e.g., a flash memory, sometimes the voltage level of a word line needs to be boosted to a level higher than a power supply voltage VCC in order to compensate for the variation of a memory cell current due to process limitations and also to more efficiently complete a function, e.g., a read function. Once the word line voltage is boosted, some circuits use a continuous charge pump operation to sustain the boosted voltage level by continuously supplying current. However, continuous charge pump operation results in extra power consumption.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
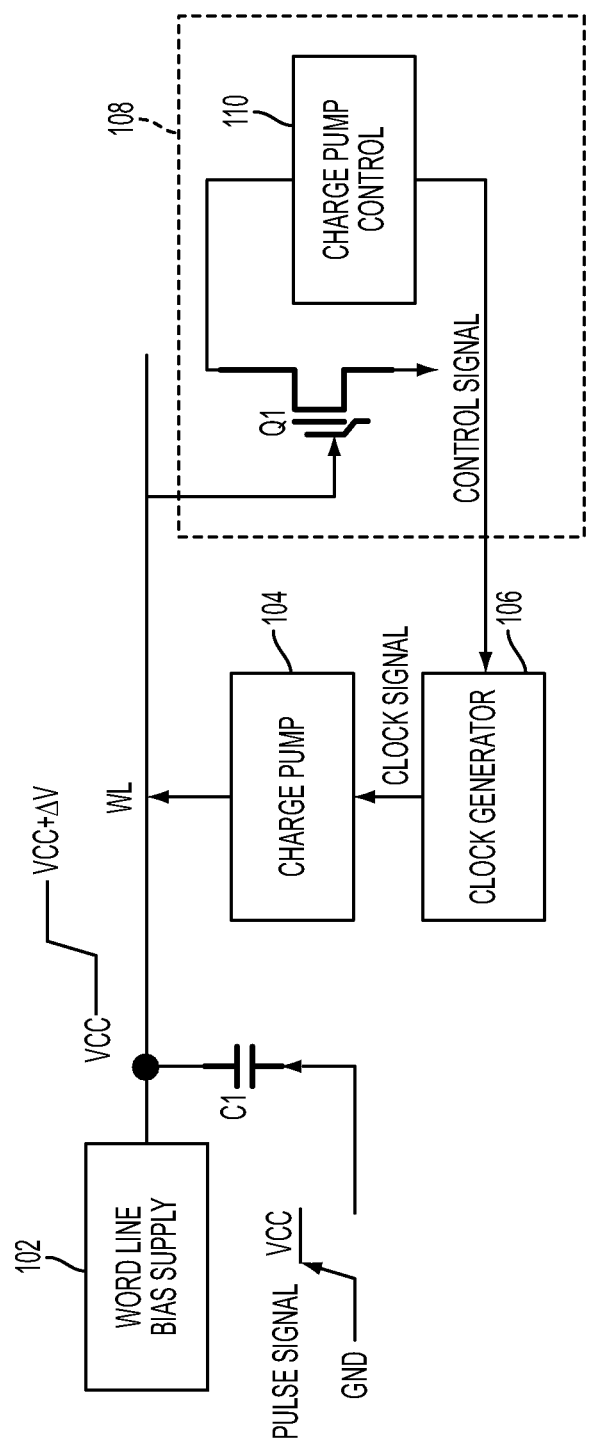
FIG. 1 is a high level functional diagram showing an exemplary charge pump power management circuit for a memory according to some embodiments.

FIG. 1 is a high-level functional diagram showing an exemplary charge pump power management circuit for a memory according to some embodiments. A word line bias supply 102, a boost capacitor C1, a charge pump 104, and a dynamic feedback control circuit 108 are coupled to a word line WL. A clock generator 106 is coupled to the charge pump 104. The clock generator 106 is controlled by the charge pump control circuit 110 of the dynamic feedback control circuit 108.

A memory cell Q1, e.g., a flash memory cell, is used to detect the WL voltage level in the dynamic feedback control circuit 108, e.g., by detecting the current flow through the memory cell Q1. The memory cell Q1 has similar I-V characteristics as those of other neighboring normal memory cells (not shown) in the memory, and it will have similar local process, voltage, and temperature (PVT) variations as the neighboring normal memory cells. The status of the memory cell Q1 can be set as necessary for each application. For example, the status of the memory cell Q1 can be set (e.g., having a logical 1 or a logical 0, etc.) to represent the most conductive situation. In one embodiment, the pre-charge state of the floating gate of the memory cell Q1 is in "erased" state.

During a read operation, the word line WL is initially supplied a power supply voltage VCC. Then a pulse signal coupled to the boost capacitor C1 is raised from GND to VCC, and the WL voltage level (the voltage level at the word line WL) is boosted from VCC to VCC+ΔV through the boost capacitor C1. If the WL voltage level is maintained at VCC+ΔV, or no lower than a lower threshold voltage V_low, the dynamic feedback control circuit 108 disables the clock generator 106 (and the charge pump 104). In at least one embodiment, V_low is greater than VCC.

If the WL voltage level decreases below the lower threshold voltage V_low, the dynamic feedback control circuit 108 detects the current decrease in the memory cell Q1 and generates a control (enable) signal to activate the clock generator 106. The clock generator 106 sends out series of clock signals to enable the charge pump 104 that pumps charges to raise the WL voltage level back up to the voltage level above V_low. If the WL voltage level is increased above a high threshold voltage V_high, the dynamic feedback control circuit 108 shuts down the clock generator 106 with a control (disable) signal in order to reduce power consumption.

Figure 2:
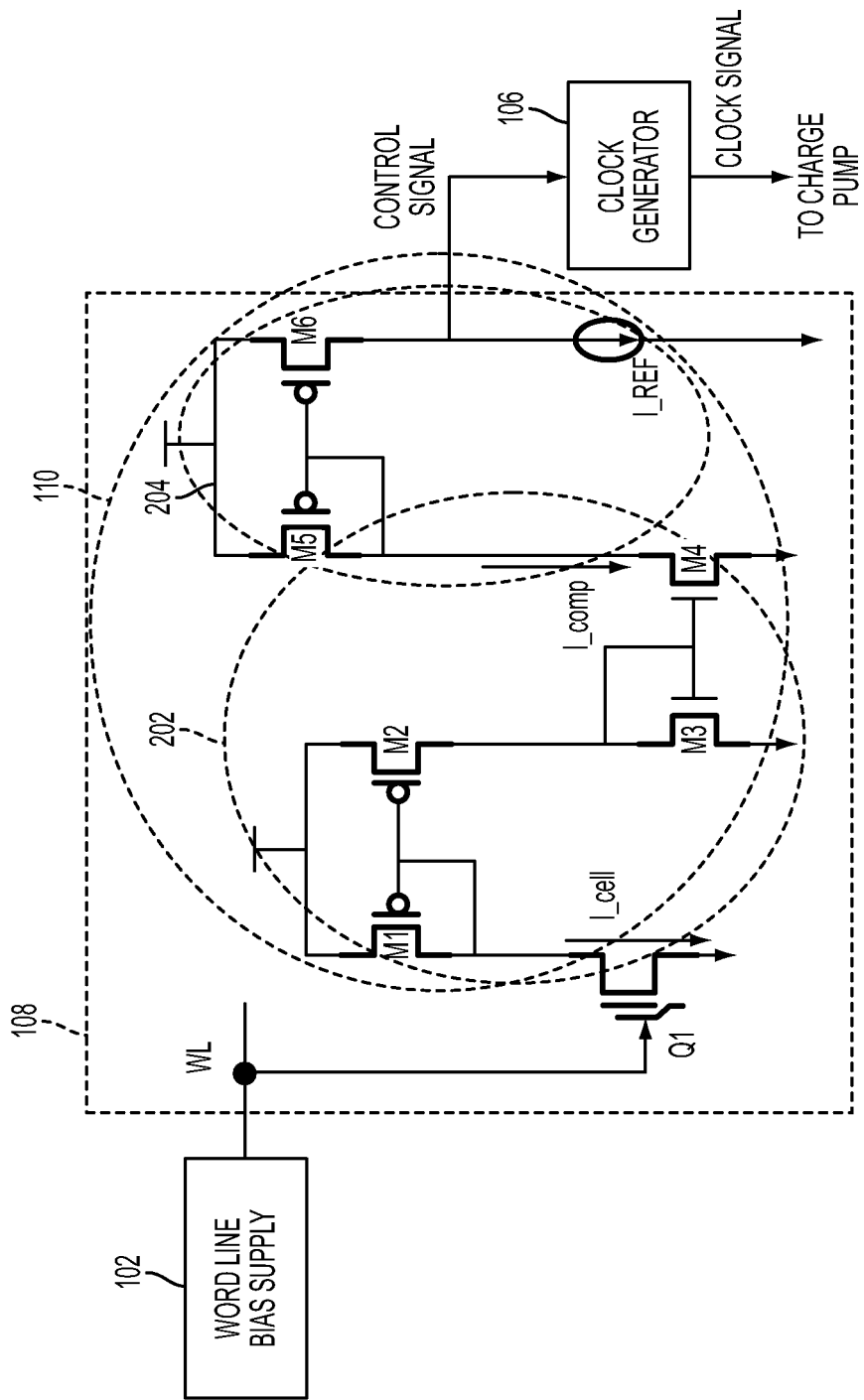
FIG. 2 is a schematic diagram showing an exemplary implementation of the charge pump power management circuit in FIG. 1 according to some embodiments.

FIG. 2 is a schematic diagram showing an exemplary implementation of the charge pump power management circuit in FIG. 1 according to some embodiments. The dynamic feedback control circuit 108 comprises the memory cell Q1, a current detection circuit 202, and a feedback control circuit 204. In at least one embodiment, the current detection circuit 202 is implemented with a current mirror circuit having P-channel Metal-Oxide Semiconductor (PMOS) transistors M1 and M2, and N-channel Metal-Oxide Semiconductor (NMOS) transistors M3 and M4; and the feedback control circuit 204 is implemented with a comparator circuit having a current source I_ref and PMOS transistors M5 and M6.

The current through a memory cell Q1 is I_cell, which varies with the WL voltage. The memory cell Q1 is used to monitor the fluctuation of the WL voltage level (by detecting the memory cell Q1's current variation). I_comp is a duplication of I_cell by the current detection circuit 202 (using a current mirror configuration). I_comp is compared with I_ref in the feedback control circuit 204 to generate the control (enable/disable) signal supplied to the clock generator 106.

When the control signal is low (logical 0), the clock generator 106 is enabled, while if the control signal is high (logical 1), the clock generator 106 is disabled. For example, if I_comp is less than I_ref, the control signal becomes low, and the clock generator is enabled. If I_comp is greater than I_ref, then the control signal becomes high, and the clock generator is disabled.

If the WL voltage is greater than V_high, I_comp is greater than I_ref. If the WL voltage is less than V_low, I_comp is less than I_ref. In the transition range (e.g., in between V_high and V_low), the comparison result remains the same as its previous state. For example, if the WL voltage decreases from V_high, but still higher than V_low, then I_comp is greater than I_ref. If the WL voltage rises from V_low, but is still lower than V_high, then I_comp is less than I_ref.

Iref, V_low, and V_high are determined based on the required specifications for the word line voltage and the specific implementation of the charge pump control circuit 110 in each application. For example, I_ref is set as the current value that the comparison with I_comp in the circuit in FIG. 2 can provide the functions described above for the required word line voltage and the implemented charge pump control circuit 110. (This can be verified, for example, by simulation tools for specific implementations.)

Since I_cell is the same current flowing through the memory cell Q1 and I_cell varies with the WL voltage, I_cell decreases when the WL voltage decreases. In this case, the mirrored current I_comp (from the current detection circuit 202) flowing through the NMOS transistor M4 also decreases. If I_comp decreases to a level lower than I_ref, then the control signal becomes low and the clock generator 106 is activated. Then the clock generator 106 generates clock signals to trigger charge pump 104 to pump the WL voltage level higher. Once the WL voltage is higher than V_high, I_comp is greater than I_ref, and the control signal becomes high, thus the clock generator 106 is disabled. Then the WL voltage decreases and the process repeat.

Figure 3:
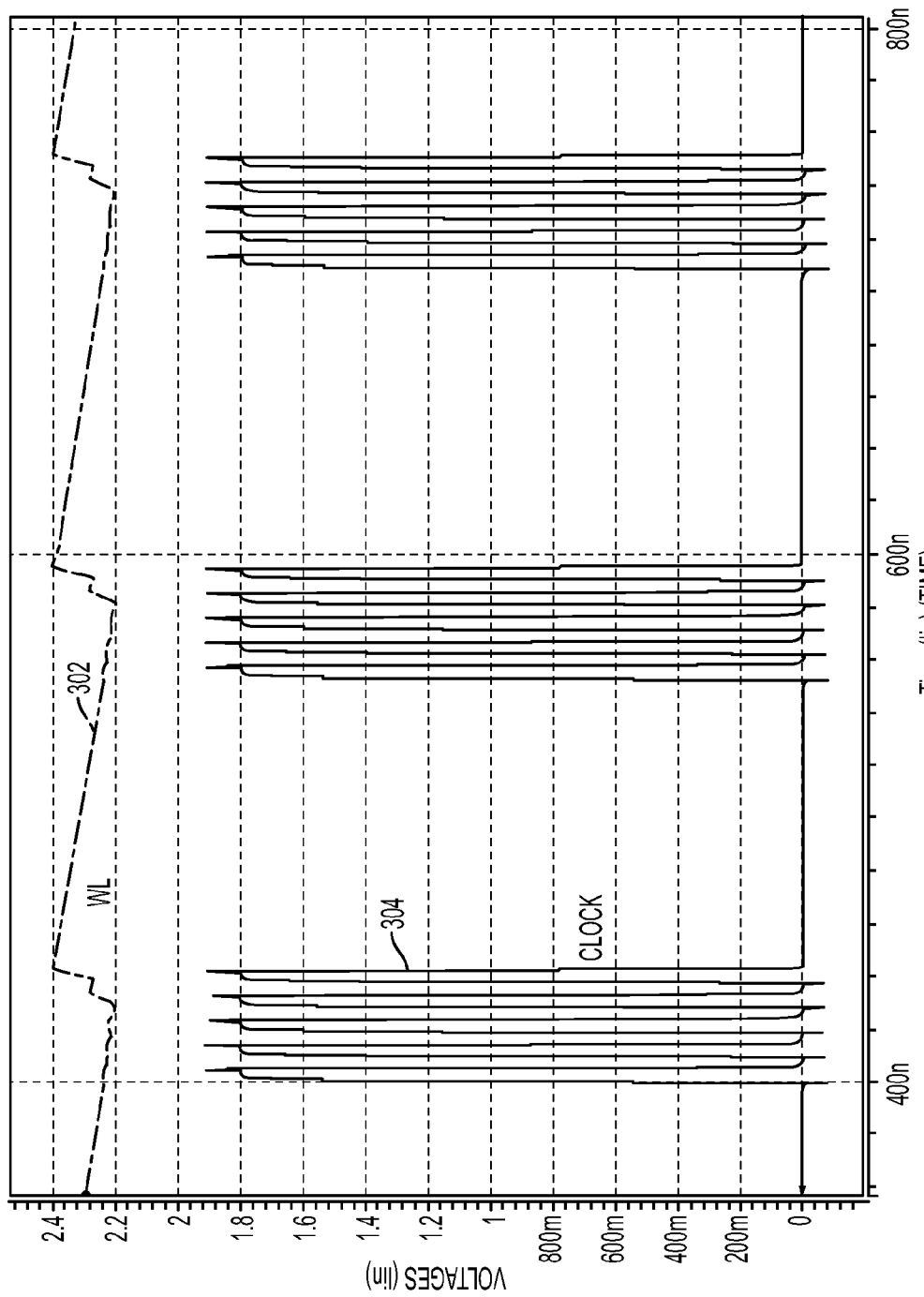
FIG. 3 is a plot showing waveforms of the exemplary charge pump power management circuit in FIG. 1 according to some embodiments.

FIG. 3 is a plot showing waveforms of the exemplary charge pump power management circuit in FIG. 1 according to some embodiments. The voltage level of the power supply VCC is set at 1.8 Volts (V). The WL voltage waveform 302 and the clock signal waveform 304 show that the clock signal 304 is generated when the WL voltage decreases to a certain level, e.g. about 2.24 V, and deactivated when the WL voltage increases to another level, e.g., 2.4 V. The result is that the WL voltage is kept within a certain voltage range, e.g., from 2.2 V to 2.4 V without operating the charge pump 104 continuously. Therefore, the dynamic feedback control circuit 108 reduces the current/power consumption of the charge pump 104 by selectively operating the charge pump 104. (The charge pump 104 is controlled by the dynamic feedback control circuit 108.)

Figure 4:
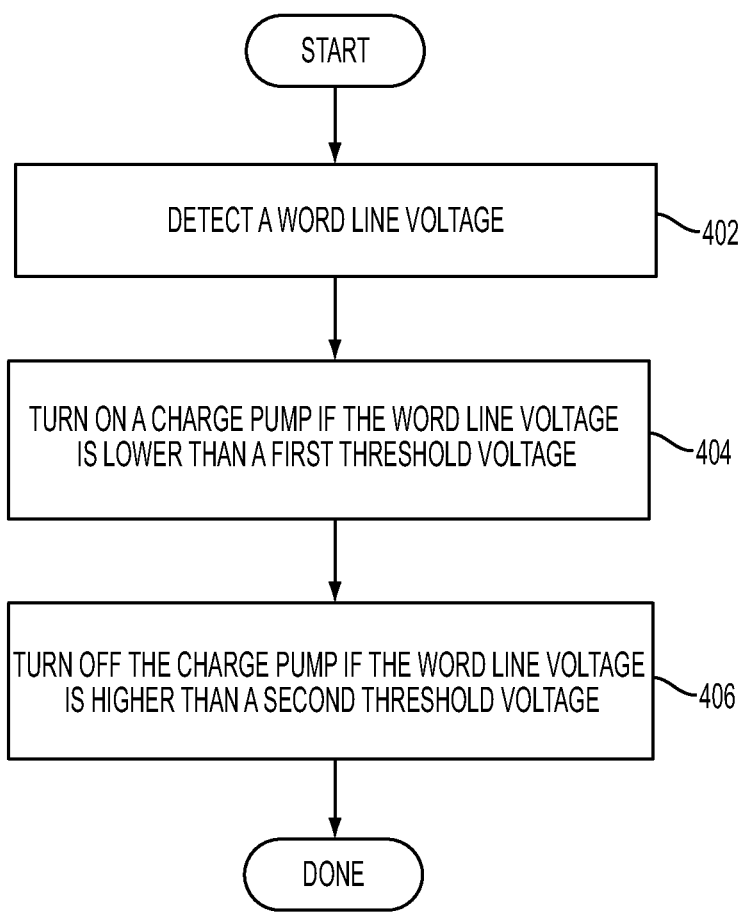
FIG. 4 is a flowchart for a method of charge-pumping using the exemplary charge pump power management circuit in FIG. 1 according to some embodiments.

FIG. 4 is a flowchart for a method of charge-pumping using the exemplary charge pump power management circuit in FIG. 1 according to some embodiments. At step 402, a word line voltage is detected. At step 404, a charge pump, e.g., 104, is turned on if the word line voltage is lower than a first threshold voltage, e.g., V_low. At step 406, the charge pump is turned off, if the word line voltage is higher than a second threshold voltage, e.g., V_high.

In various embodiments, detecting the word line voltage includes detecting a cell current, e.g., I_cell, in a memory cell, e.g., Q1, of the memory. In one example, the cell current, e.g., I_cell, is duplicated utilizing a current mirror circuit. The duplicated cell current, e.g., I_comp, is compared to a reference current, I_ref. In one example, the word line voltage is compared to the first threshold voltage, e.g., V_low, and/or the second threshold voltage, e.g., V_high.

In various embodiments, a control signal is supplied to a clock generator, e.g., 106, that is coupled to the charge pump, e.g., 104. To turn on the charge pump, e.g., 104, the clock generator, e.g., 106, is enabled to generate a clock signal and supply the clock signal to the charge pump, e.g., 104. To turn off the charge pump, e.g., 104, the clock generator, e.g., 106, is disabled.

According to some embodiments, a memory includes a word line, a charge pump coupled to the word line, and a charge pump control circuit coupled to the charge pump. The charge pump control circuit is configured to turn on the charge pump if the word line voltage is lower than a first threshold voltage and turn off the charge pump if the word line voltage is higher than a second threshold voltage.

According to some embodiments, a method for a charge pump coupled to a word line of a memory includes detecting a word line voltage. The charge pump is turned on if the word line voltage is lower than a first threshold voltage. The charge pump is turned off if the word line voltage is higher than a second threshold voltage.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory, comprising:
  a word line;
  a charge pump coupled to the word line; and
  a charge pump control circuit coupled to the charge pump,
  wherein the charge pump control circuit is configured to turn on the charge pump if a word line voltage on the word line is lower than a first predetermined threshold voltage and turn off the charge pump if the word line voltage is higher than a second predetermined threshold voltage,
  wherein the charge pump control circuit comprises a current detection circuit,
  wherein the current detection circuit comprises a current mirror circuit,
  wherein the current mirror circuit comprises a first PMOS transistor, a second PMOS transistor, a first NMOS transistor, and a second NMOS transistor, and
  wherein a drain of the second PMOS transistor is coupled to a drain of the first NMOS transistor, a gate of the first NMOS transistor, and a gate of the second NMOS transistor.

2. The memory of claim 1, further comprising a clock generator coupled between the charge pump and the charge pump control circuit.

3. The memory of claim 2, wherein
  the charge pump control circuit further comprises a memory cell coupled to the word line,
  the current detection circuit is coupled to the memory cell, and
  the current detection circuit is configured to detect a cell current of the memory cell, the cell current variable with the word line voltage.

4. The memory of claim 3, wherein a drain of the first PMOS transistor is coupled to a gate of the first PMOS transistor, a gate of the second PMOS transistor, and the memory cell.

5. The memory of claim 3, wherein the charge pump control circuit further comprises a feedback control circuit coupled to the current detection circuit, wherein the feedback control circuit is configured to generate a control signal for the clock generator.

6. The memory of claim 5, wherein the feedback control circuit comprises a comparator circuit.

7. The memory of claim 6, wherein the comparator circuit comprises a current source having a reference current, and the comparator circuit is configured to compare the cell current to the reference current.

8. A method of charge-pumping a word line of a memory using a charge pump coupled to the word line, the method comprising:
    detecting a word line voltage on the word line;
    turning on the charge pump if the word line voltage is lower than a first predetermined threshold voltage; and
    turning off the charge pump if the word line voltage is higher than a second predetermined threshold voltage,
    wherein detecting the word line voltage comprises detecting a cell current in a memory cell of the memory, the memory cell coupled to the word line, the cell current varying with the word line voltage,
    wherein detecting the cell current in the memory cell is performed by a current detection circuit,
    wherein the current detection circuit comprises a current mirror circuit,
    wherein the current mirror circuit comprises a first PMOS transistor, a second PMOS transistor, a first NMOS transistor, and a second NMOS transistor, and
    wherein a drain of the second PMOS transistor is coupled to a drain of the first NMOS transistor, a gate of the first NMOS transistor, and a gate of the second NMOS transistor.

9. The method of claim 8, further comprising comparing the cell current to a reference current.

10. The method of claim 8, wherein detecting the cell current comprises duplicating the cell current utilizing the current mirror circuit.

11. The method of claim 8, further comprising comparing the word line voltage to the first threshold voltage.

12. The method of claim 8, further comprising comparing the word line voltage to the second threshold voltage.

13. The method of claim 8, further comprising supplying a control signal to a clock generator coupled to the charge pump.

14. The method of claim 13, wherein turning on the charge pump comprises enabling the clock generator to generate a clock signal and supplying the clock signal to the charge pump.

15. The method of claim 13, wherein turning off the charge pump comprises disabling the clock generator.

16. A memory, comprising:
    a word line;
    a charge pump coupled to the word line; and
    a charge pump control circuit coupled to the charge pump, the charge pump control circuit comprising:
        a memory cell coupled to the word line; and
        a current detection circuit coupled to the memory cell, wherein the current detection circuit is configured to detect a cell current of the memory cell, the cell current variable with a word line voltage on the word line;
    wherein the charge pump control circuit is configured to turn on or off the charge pump based on the cell current detected by the current detection circuit,
    wherein the current detection circuit comprises a current mirror circuit,
    wherein the current mirror circuit comprises a first PMOS transistor, a second PMOS transistor, a first NMOS transistor, and a second NMOS transistor, and
    wherein a drain of the second PMOS transistor is coupled to a drain of the first NMOS transistor, a gate of the first NMOS transistor, and a gate of the second NMOS transistor.

17. The memory of claim 16, wherein the charge pump control circuit further comprises a comparator circuit coupled to the current detection circuit and configured to generate a control signal to turn on the charge pump when the detected cell current is lower than a reference current and turn off the charge pump when the detected cell current is higher than the reference current.

18. The memory of claim 16, further comprising:
    a clock generator coupled to the charge pump and to the comparator circuit of the charge pump control circuit, the clock generator configured to turn on or off the charge pump based on the control signal generated by the comparator circuit.

* * * * *